United States Patent
Wu et al.

(10) Patent No.: US 8,572,300 B2
(45) Date of Patent: Oct. 29, 2013

(54) PHYSICAL CODING SUBLAYER (PCS) ARCHITECTURE FOR SYNCHRONIZING DATA BETWEEN DIFFERENT REFERENCE CLOCKS

(75) Inventors: Shih-Chi Wu, Zhubei (TW); Meng-Chin Tsai, Beigang Township, Yunin County (TW); Liang-Hung Chen, Hsinchu (TW); Jung-Chi Huang, Xiushui Township, Changhua County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 58 days.

(21) Appl. No.: 13/281,505

(22) Filed: Oct. 26, 2011

(65) Prior Publication Data

US 2013/0111083 A1    May 2, 2013

(51) Int. Cl.
    *G06F 3/00* (2006.01)
(52) U.S. Cl.
    USPC ............... 710/52; 710/29; 710/30; 710/33; 710/34; 710/61; 710/65; 710/66; 710/305; 710/310; 370/464; 370/465; 370/469; 370/470; 370/471; 370/472; 370/473; 370/474
(58) Field of Classification Search
    None
    See application file for complete search history.

(56) References Cited

U.S. PATENT DOCUMENTS

| | | | | |
|---|---|---|---|---|
| 4,486,739 A * | 12/1984 | Franaszek et al. | | 341/59 |
| 7,012,935 B2 * | 3/2006 | Woelk et al. | | 370/503 |
| 7,230,549 B1 * | 6/2007 | Woodral et al. | | 341/52 |
| 7,287,176 B2 * | 10/2007 | Kim et al. | | 713/500 |
| 7,590,778 B2 * | 9/2009 | Ludwig et al. | | 710/56 |
| 7,978,802 B1 * | 7/2011 | Raha et al. | | 375/371 |
| 7,995,695 B2 * | 8/2011 | Ahmed et al. | | 375/371 |
| 8,161,210 B1 * | 4/2012 | Norrie | | 710/65 |
| 8,285,884 B1 * | 10/2012 | Norrie | | 710/14 |
| 2003/0161351 A1 * | 8/2003 | Beverly et al. | | 370/535 |
| 2003/0214975 A1 * | 11/2003 | Woelk et al. | | 370/503 |
| 2003/0219040 A1 * | 11/2003 | Kim et al. | | 370/503 |
| 2006/0117125 A1 * | 6/2006 | Tseng | | 710/301 |
| 2006/0230215 A1 * | 10/2006 | Woodral | | 710/310 |

(Continued)

OTHER PUBLICATIONS

'Implementation of PCS of Physical Layer for PCI Express' a Thesis by M. Dinesh Kumar, National Institute of Technology, Rourkela, 2007-2009.*

(Continued)

*Primary Examiner* — Steven Snyder
(74) *Attorney, Agent, or Firm* — Duane Morris LLP (57) ABSTRACT

A physical coding sublayer includes a first channel configured to receive a first encoded data stream from a physical media attachment layer and to provide a first decoded data stream to a media access layer. The first channel includes a first circuit configured to detect synchronization headers in the first encoded data stream received from the physical media attachment layer, a decoding circuit configured to decode the encoded data stream and to adjust a width of the received data from a first width to a second width based on a signal identifying the synchronization headers received from the first circuit, and a first single configured to compensate for clock differences between the physical media attachment layer and the media access layer to which the first buffer provides the first decoded data stream.

18 Claims, 9 Drawing Sheets

(56) References Cited

U.S. PATENT DOCUMENTS

| | | | |
|---|---|---|---|
| 2007/0038912 A1* | 2/2007 | Hashimoto et al. | 714/755 |
| 2007/0262891 A1* | 11/2007 | Woodral et al. | 341/51 |
| 2008/0005429 A1* | 1/2008 | Ludwig et al. | 710/68 |
| 2008/0294966 A1* | 11/2008 | Kuroishi et al. | 714/776 |
| 2009/0323722 A1* | 12/2009 | Sharma | 370/470 |
| 2010/0325135 A1* | 12/2010 | Chen et al. | 707/759 |
| 2011/0243211 A1* | 10/2011 | Chacko et al. | 375/228 |
| 2012/0087412 A1* | 4/2012 | Chuang | 375/240.16 |
| 2012/0307878 A1* | 12/2012 | Vijayaraghavan et al. | 375/225 |

OTHER PUBLICATIONS

PCI Express® Base Specification Revision 3.0, Nov. 10, 2010, PCT Express, pp. 1-860.

PHY Interface for the PCI Express* Architecture, PCI Express 3.0, Revision .9, 2007-2010 Intel Corporation, pp. 1-53.

PCI Express—An Overview of the PCI Express Standard, Tutorial published Aug. 13, 2009, http://zone.ni.com/devzone/cda/tut/p/id/3767, 10 pages.

Bhatt, A.V., "Creating a PCI Express™ Interconnect", Technology and Research Labs, Intel Corporation, 8 pages, http://www.intel.com/technology/3gio and http://www.pcisig.com, copyright 2002.

\* cited by examiner

PHYSICAL CODING SUBLAYER (PCS) ARCHITECTURE FOR SYNCHRONIZING DATA BETWEEN DIFFERENT REFERENCE CLOCKS

FIELD OF DISCLOSURE

The disclosed system and method relate to data transfer between integrated circuits. More specifically, the disclosed system and method relate to an architecture for a physical coding sublayer of a peripheral component interconnect express standard.

BACKGROUND

Peripheral Component Interconnect Express ("PCIe") is a high-throughput bus standard developed by many technology companies. The specification sets forth a data transmission protocol and system architecture for transferring data. One portion of the PCIe specification sets forth a physical layer ("PHY") architecture, which isolates the transaction and data link layers from the signaling technology used for link data exchange.

The PHY layer, or physical interface for the PCIE architecture ("PIPE"), is conceptually divided into a physical sub-block and a logical sub-block. The physical sub-block includes a Physical Media Attachment ("PMA") layer, and the logical sub-block includes a Media Access ("MAC") layer and a Physical Coding Sublayer ("PCS"). The PCS provides an interface between the MAC and PMA layers. However, the conventional PCS architecture is complex and does not show how to solve the 130 bit block boundary being broken by the variable length skip ("SKP") ordered set in the PIPE.

DETAILED DESCRIPTION

Figure 1:
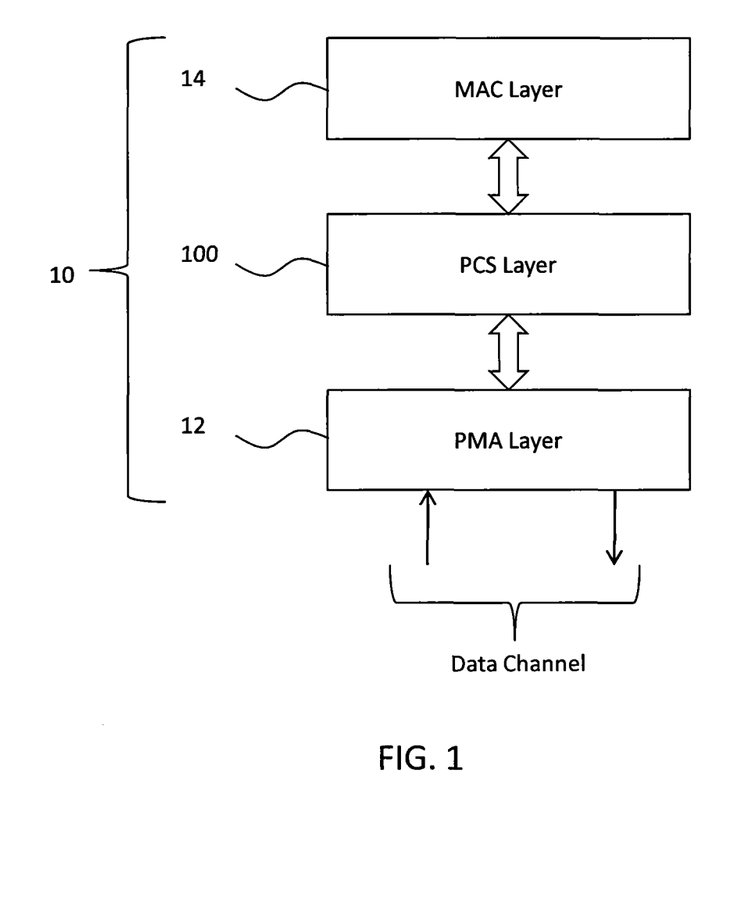
FIG. 1 is a block diagram of one example of an improved physical layer of a device in accordance with the Peripheral Component Interconnect Express standard.

FIG. 1 is a block diagram illustrating the physical layer 10 of the Peripheral Component Interconnect Express ("PCIe") standard. The PCIe standard or specification provides for various platform interconnect usages including, but not limited to, chip-to-chip and board-to-board by connectors or cabling that may be implemented in computing devices such as servers, desktops, mobile computers, and in other communication devices. Interconnects in accordance with the PCIe specification provide a link between two devices, and the link may be operating at different clock speeds. As shown in FIG. 1, physical layer 10 includes a Physical Media Attachment ("PMA") layer 12 coupled to a Media Access ("MAC") layer 14 by a Physical Coding Sublayer ("PCS") 100. PCS 100 is configured to perform coding and decoding of data transmitted between PMA layer 12 and MAC layer 14.

Figure 2:
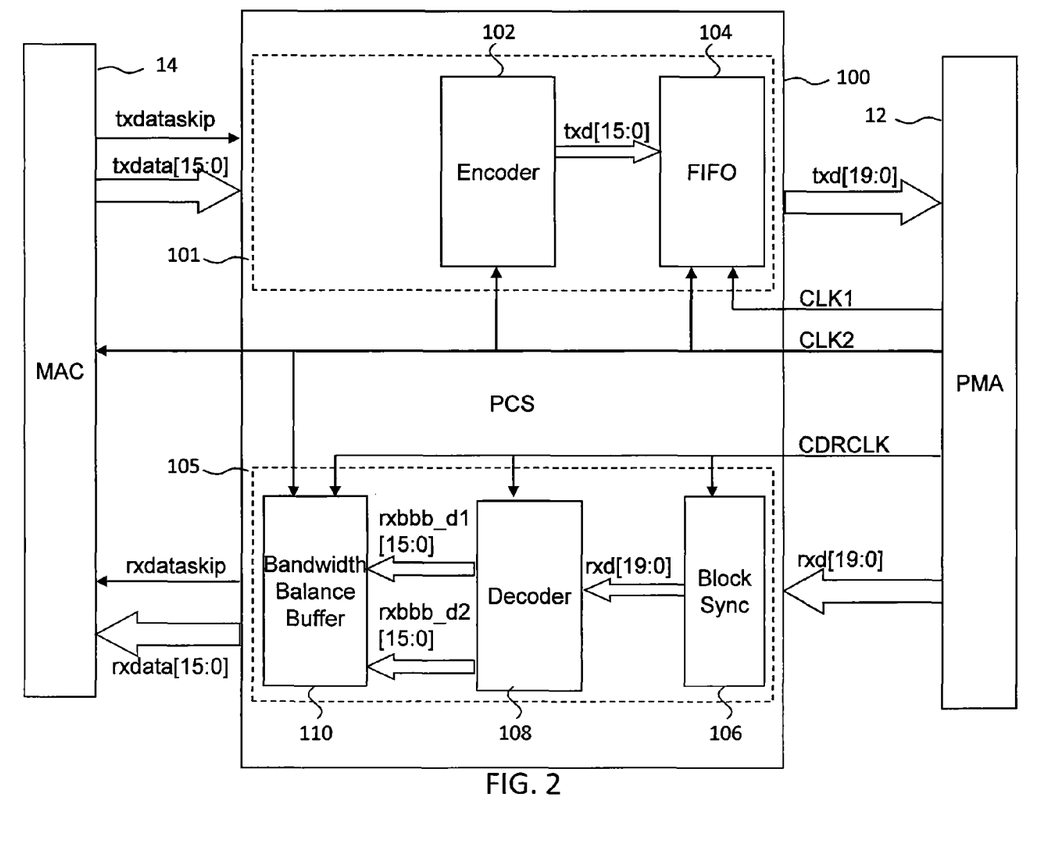
FIG. 2 is a block diagram of the functional components of an improved physical coding sublayer in accordance with the physical layer illustrated in FIG. 1.

FIG. 2 is a block diagram illustrating one example of an improved architecture of PCS 100. As shown in FIG. 2, PCS 100 includes a transmission path 101 comprising an encoder circuit 102 coupled to a first-in-first-out ("FIFO") register 104. A receiving channel 105 includes a block synchronization ("sync") circuit 106, a decoder circuit 108, and a buffer 110.

Encoder circuit 102 may include logic gates and flip-flops such that encoder 102 may encode data transmitted from MAC layer 14 from a 128 bit ("128b") format to 130 bit ("130b") format in accordance with the PCIe standard. For example, for each 128 bits that are moved across the PIPE interface, the PHY layer transmits 130 bits, i.e., the 128 bits and a two-bit header to which the 128b data payload is appended by encoder circuit 102. In some embodiments, headers of '10' may be added to the front of 128b data blocks to create 130b data blocks.

Encoder circuit 102 may also be configured to add headers to ordered set blocks, which may be of variable lengths. Such ordered set blocks may be appended to sync headers of '01' by encoder circuit 102. Encoder 102 is configured to add the headers to the received transmission data, txdata, and a transmission data skip signal, txdataskip, received from MAC layer 14. Encoder circuit 102 also receives a parallel interface data clock signal, CLK2, which is also provided to MAC layer 14, from PMA layer 12.

FIFO 104 receives clock signal CLK1 and a second clock signal, CLK2, from PMA 12. CLK1 is coupled to the output of FIFO 104. In some embodiments, FIFO 104 functions as a data width transfer buffer configured to provide an interface between the different operation rates of MAC layer 14 and PMA layer 12. Clock signal CLK2 may have a frequency that is faster than the frequency of the clock signal CLK1. In some embodiments, clock signal CLK1 has a frequency of approximately 400 MHz, and the second clock signal CLK2 has a frequency of approximately 500 MHz. However, one skilled in the art will understand that clock signals CLK1 and CLK2 may have other frequencies.

Turning now to the receiving channel 105, block sync circuit 106 receives reception data (rxd) and a clock and data recovery ("CDR") clock signal (CDRCLK) from PMA 12. The output of block sync circuit 106 is coupled to decoder 108, which also receives CDRCLK. Decoder 108 outputs a pair of data streams, rxbbb_d1 and rxbbb_d2, to bandwidth balance buffer 110. Bandwidth balance buffer 110 receives the two data streams from decoder 108 and clock signals CLK2 and CDRCLK from PMA 12. The received data (rx-data) and a receive data skip signal (rxdataskip) are output to MAC layer 14 from buffer 110.

Figure 3A:
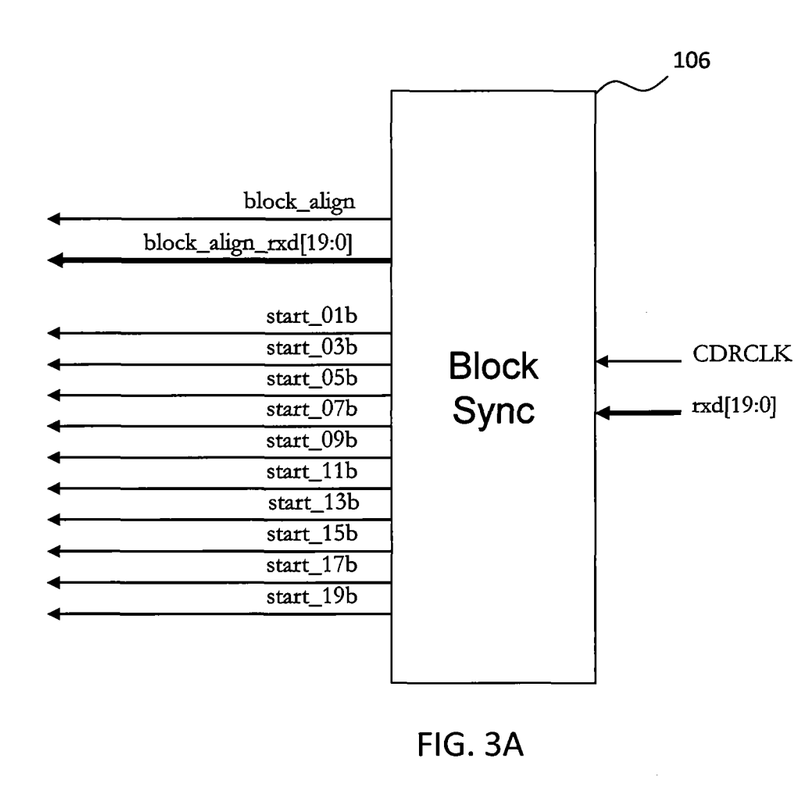
FIG. 3A is one example of the inputs and outputs of a block synchronization circuit in accordance with the physical coding sublayer illustrated in FIG. 2.

FIG. 3A illustrates one example of the inputs and outputs of block sync circuit 106. In some embodiments, for example, block sync circuit 106 receives a 20 b serial data stream, rxd[19:0], and a clock signal, CDRCLK, from PMA 12. Although the basic PCIe generation 3 transmission unit is 130 bits (128 bits plus a two-bit header), skip ordered sets, SKP, which are used for compensating for different bit rates for two communicating ports, may have variable lengths. In the PCIe specification, four symbols (i.e., 32 bits) can be added and removed by a port such that the SKIP ordered set blocks may have of lengths of 66 bits, 98 bits, 130 bits, 162 bits, or 194 bits.

Figure 3B:
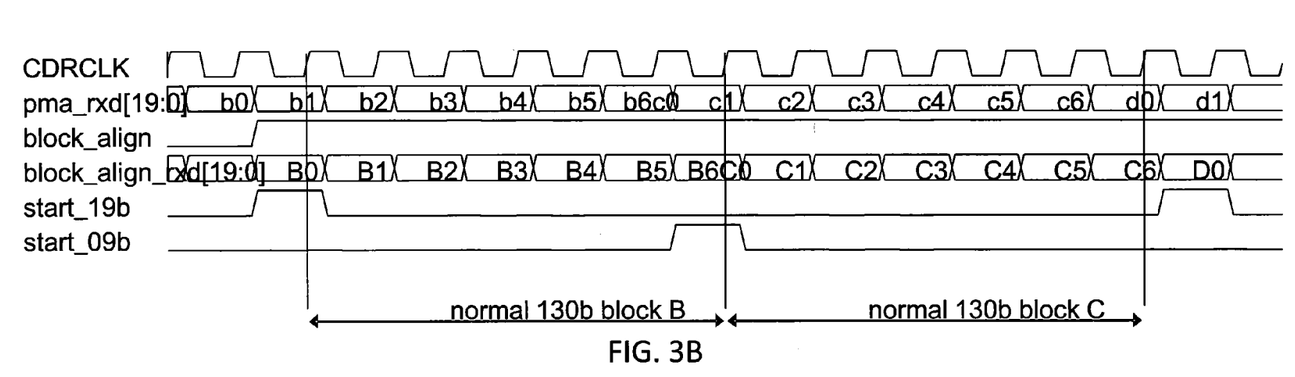
FIG. 3B is a timing diagram of one example of an output of a block synchronization circuit in response to receiving data blocks.

Block sync circuit 106 identifies the block boundary of 130b data blocks and SKP ordered set blocks and outputs signals to decoder 108 that indicates these block boundaries. FIG. 3B is a timing diagram of one example of an output of block sync circuit 106 in response to receiving a 130b data block. As shown in FIG. 3B, block sync circuit 106 transitions signal block_align from a logic zero to a logic one if aligned data, block_align_rxd, is being output. The block_align signal is asserted high when the block boundary is detected and output. The boundaries of the 130b data block are indicated by asserting signal start_19 b at the beginning of a 130b data block and asserting signal start_09 b for the next 130b data block in the example.

Figure 3C:
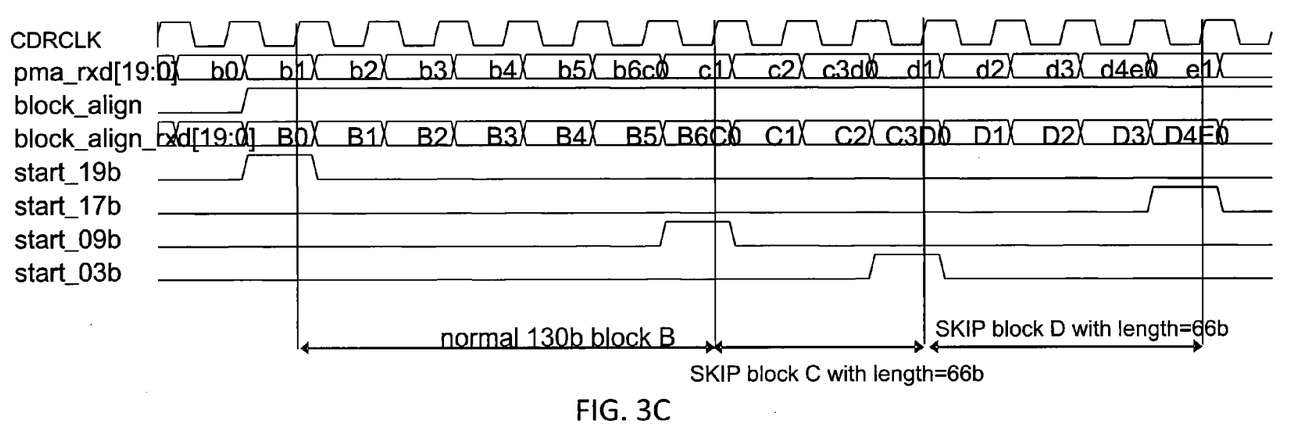
FIG. 3C is a timing diagram of one example of an output of a block synchronization circuit in response to receiving data blocks and variable length skip, SKP, ordered set blocks.

When a SKP ordered set block is received at block sync circuit 106, block sync circuit 106 uses start_3 b, start_09 b, start_17 b, and start_19 b signals to indicate the boundaries of each of the 130b data blocks and the SKP ordered set blocks for example. As shown in FIG. 3C, block sync circuit 106 asserts signal start_19 b at the beginning boundary of a 130b data block. The end boundary of the 130b data block 106 is identified by asserting signal start_09 b while the last bit in the data block is output from block sync circuit 106. The end of a first SKP ordered set block is indicated by asserting signal start_03 b during the output of a last bit of the first SKP ordered set block, and the end of a second SKP ordered set block is indicated by asserting signal start_17 b during the output of a last bit of the second SKP ordered set block. Block sync circuit 106 also indicates that the output blocks are aligned by asserting the block_align signal.

Figure 4A:
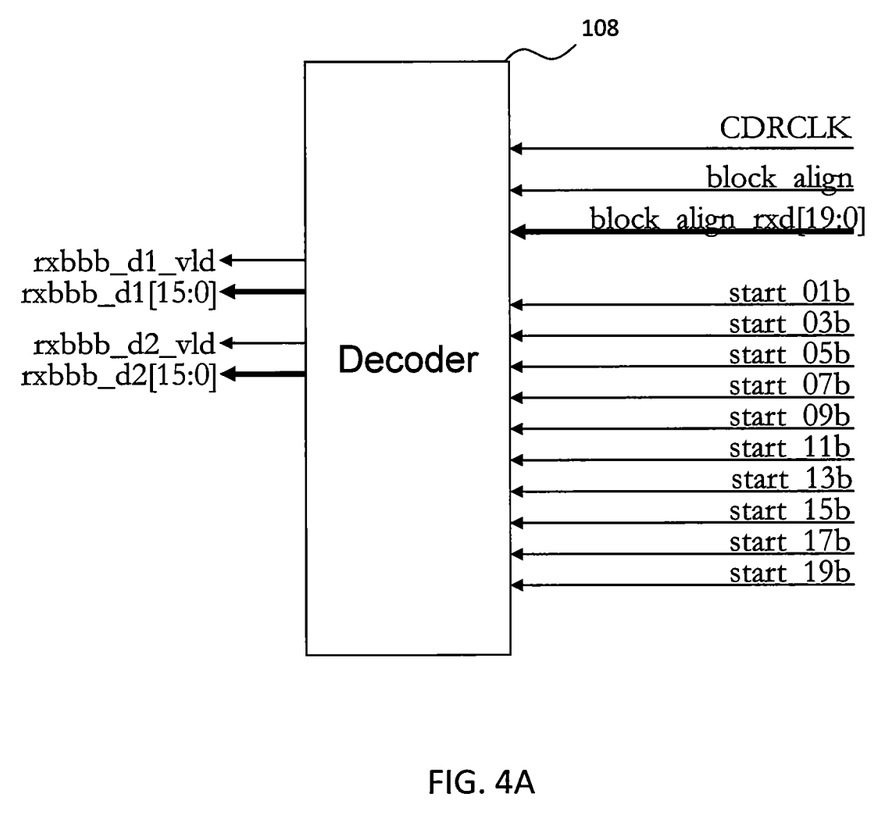
FIG. 4A is one example of the inputs and outputs of a decoder circuit in accordance with the physical coding sublayer illustrated in FIG. 2.
Figure 4B:
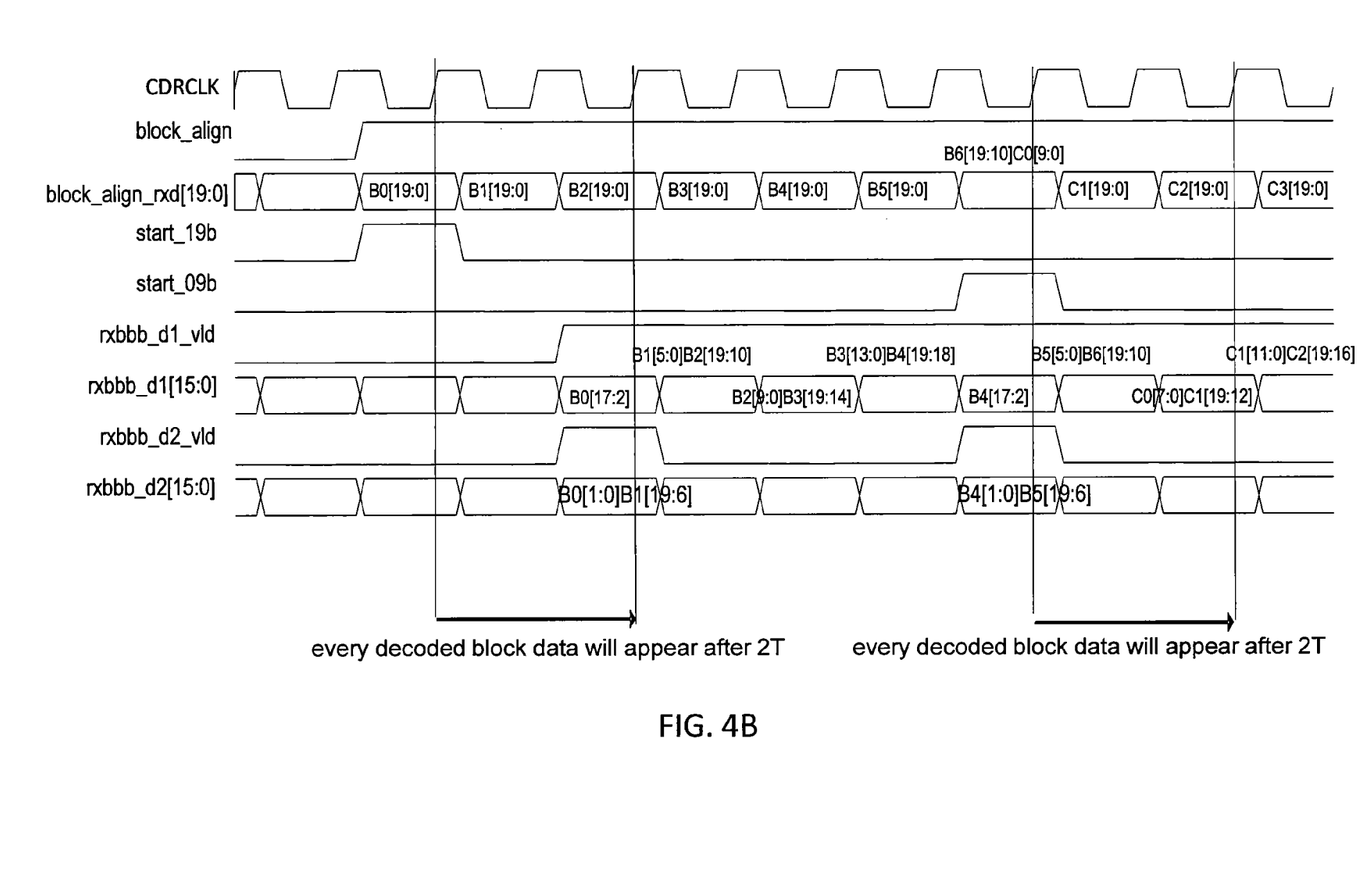
FIG. 4B is a timing diagram of one example of the outputs of a decoder circuit in accordance with FIG. 4A in response to data and signals received from a block synchronization circuit in accordance with FIG. 3A.

Turning now to FIG. 4A, the various control/timing signals and data output from block sync circuit 106 are received at decoder circuit 108. Decoder 108 may include one or more logic gates and flip-flops as will be understood by one skilled in the art. Decoder 108 receives 130b aligned data blocks in 20-bit serial data streams and is configured to output two 16-bit data streams to bandwidth balance buffer 110 to compensate for the different bit widths of the input and output data streams. The second 16-bit output data stream is usually valid for every fourth input data stream as shown in FIG. 4B. Decoder 108 is also configured to convert the 130b data stream to a 128b data stream by removing the two-bit headers. As described above, the 130b data blocks have a 128b payload affixed to a header of '10', and the ordered set blocks are affixed to '01' sync headers.

As shown in FIG. 4B, decoder 108 receives a signal from block sync circuit 106 indicating the start of a 130b data block by signals start_09 b or start_019b, the block_align signal indicating the data is aligned, and the aligned data at block_align_rxd[19:0]. The data streams output by decoder 108, rxbbb_d1[15:0] and rxbbb_d2[15:0], after decoder strips off the first two header bits after two clock cycles of the CDRCLK clock. For example, decoder 108 drops bits [19:18] of block B0 as these bits correspond to the sync header, and outputs bits [17:2] of block B0 as data stream rxbbb_d1[15:0]. Decoder 108 also asserts signal rxbbb_d1_vld, which indicates that data stream rxbbb_d1[15:0] is being output. The next successive sixteen bits, e.g., bits [1:0] of block B0 and bits [19:6] of block B1, are output as data stream rxbbb_d2[15:0] as decoder 108 asserts signal rxbbb_d2_vld, which indicates that data stream rxbbb_d2[15:0] is being output.

Signal rxbbb_d1_vld continues to be asserted as the remaining bits of block B1, i.e., bits [5:0], are output along with bits [19:10] of block B2. Data stream rxbbb_d1[15:0] outputs the bits of blocks B2, B3, and two bits of the 20 bits of block B4 while data stream rxbbb_d2[15:0] does not output any bits and signal rxbbb_d2_vld is not asserted.

When the next 130b data block is received, as indicated by decoder 108 receiving an asserted start_09b signal, data stream rxbbb_d1[15:0] continues to output the next 16 bits of the 20 b data block B4 as rxbbb_d1_vld remains high. The final two bits of 20 b data block B4 and the first 14 bits of 20 b data block B5, e.g., bits [19:6], as data stream rxbbb_d2[15:0] as signal rxbbb_d2_vld is asserted. The remainder of 20 b block B5 is output as data stream rxbbb_d1[15:0] as data stream rxbbb_d2[15:0] stops outputting data and signal rxbbb_d2_vld is no longer asserted.

Figure 5A:
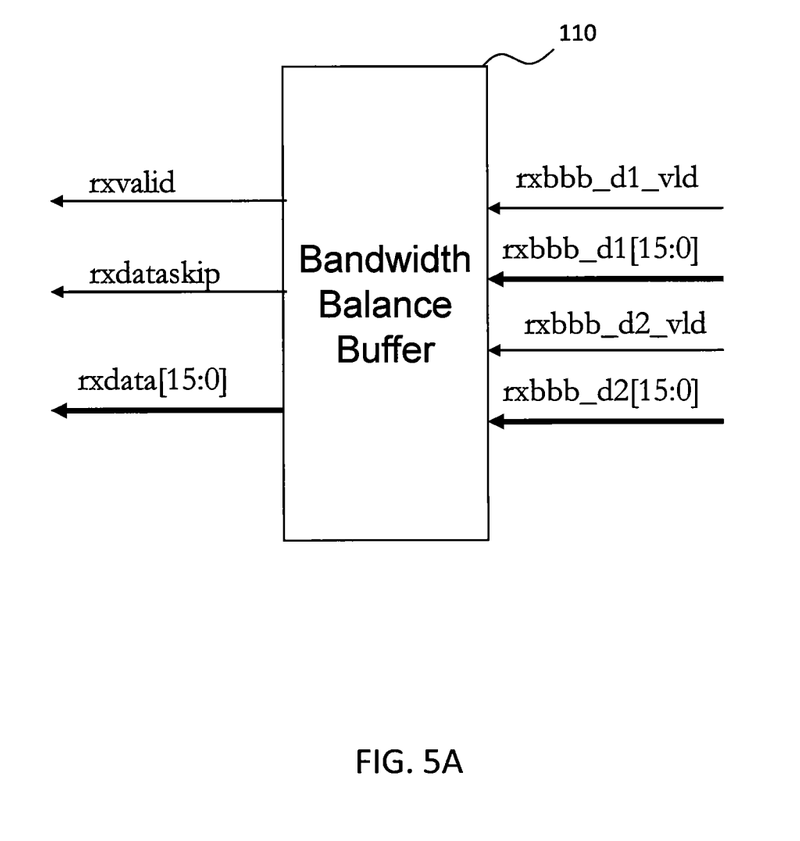
FIG. 5A is one example of the inputs and outputs of a bandwidth balance buffer in accordance with the physical coding sublayer illustrated in FIG. 2.

Bandwidth balance buffer 110 receives the 16 b data streams rxbbb_d1[15:0] and rxbbb_d2[15:0] along with signals rxbbb_d1_vld and rxbbb_d2_vld from decoder 108 as shown in FIG. 5A. Buffer 110 transfers the operation clock rate from CDRCLK to CLK2 by inputting two 16-bit data streams in accordance with the CDRCLK, which may be set at 400 MHz, for example. Buffer 110 outputs one 16-bit data stream at the rate of CLK2, which may be higher than the rate of CDRCLK, e.g., 500 MHz.

The RxdataSkip signal is asserted by buffer 110 to MAC layer 14. As described above, the block header may include 2 bits such that every eight blocks results in 16-bits of data being removed from the original 130 bit data stream. After every eighth header has been removed, buffer 110 asserts the RxdataSkip signal indicating that Rxdata[15:0] is invalid.

Bandwidth balance buffer 110 also compensates for the reference clock differences between the ends of a PCIe link. For example, CLK2 may be generated by a local end, and CDRCLK may be recovered from the other end of the PCIe link. Both clocks, CLK2 and CDRCLK, are generated from their respective reference clocks. The maximum difference of reference clock rates between two ends of a PCIe link is 600 ppm according to the PCIe specification. When the reference clocks of the ends of the PCIe link are different, PCS layer 100 will add or delete the SKP symbols in SKP ordered sets to compensate for the reference clock different. For example, if the reference clock of the local end is faster than the reference clock of the other end, PCS layer 100 will add SKP symbols in the receiving data stream to prevent underflow in the receiving path.

Figure 5B:
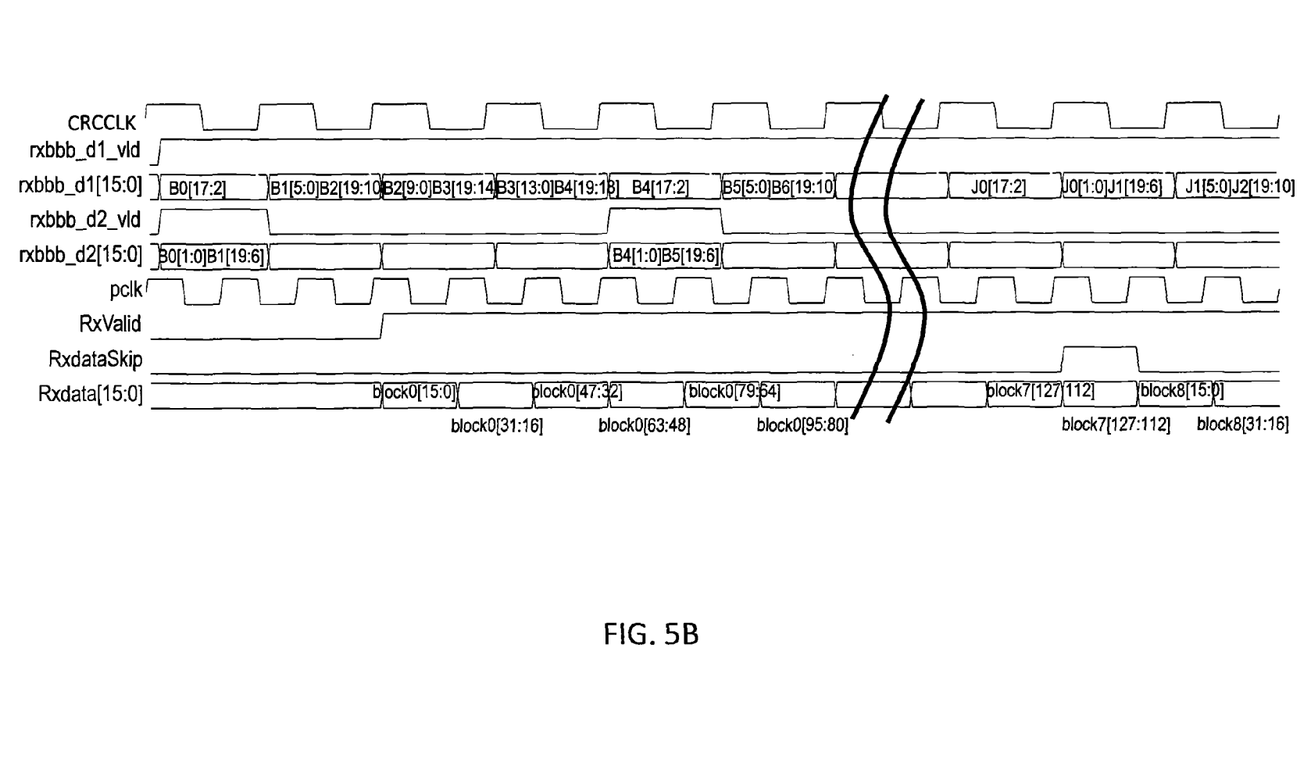
FIG. 5B is a timing diagram of one example of the signals and data output from the elastic buffer in response to receiving data and signals from the decoder illustrated in FIG. 4A.

The output of bandwidth balance buffer 110 is a 16-bit data stream Rxdata[15:0] based on received data streams rxbbb_d1 [15:0] and rxbbb_d2[15:0]. FIG. 5B illustrates the signals and data output from buffer 110 in response to receiving data and signals from decoder 108. The output data and signals RxdataSkip and RxValid are provided to MAC layer 14, which performs link training and lane-to-lane deskewing of the data based on the RxdataSkip and RxValid signals.

Figure 6A:
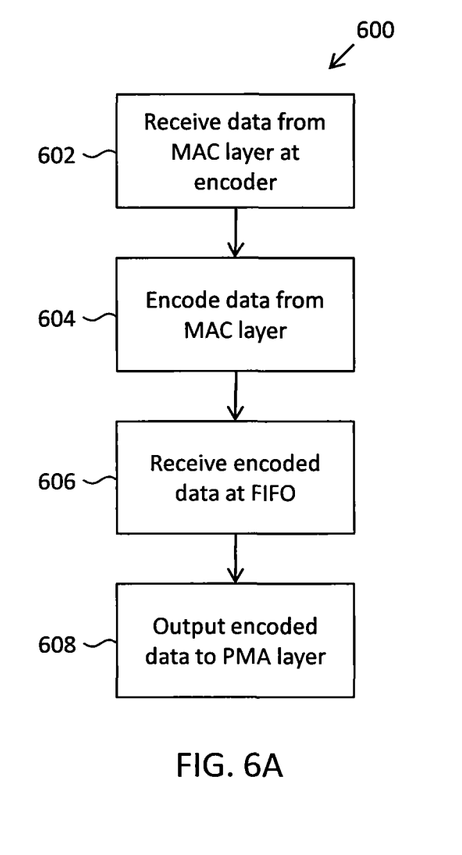
FIG. 6A is a flow diagram of one example of a method of transmitting data from a media access layer in accordance with the physical coding sublayer illustrated in FIG. 2.

One example of a method 600 of transmitting data from PCS 100 is described with reference to FIG. 6A. At block 602, a data stream is received from MAC layer 14 at encoder 102.

Encoder 102 encodes the received data by adding a header to the front of the data at block 604. As described above, for example, encoder 102 may receive a 128b data payload to which a header of '10' is added by encoder 102 to create a 130b data block. Encoder circuit 102 may also add headers of '01' to the beginning of the ordered set blocks, which may include the SKP ordered set blocks of variable lengths. Such ordered set blocks may be appended to sync headers of '01' by encoder circuit 102.

At block 606, the encoded data is provided to FIFO 104. FIFO 104 receives the encoded data and transfers the data from MAC layer 14 to PMA layer 12 based on their respective different bit rates. The encoded data is output from FIFO 104 to PMA layer 12 based on clock signals CLK1 and CLK2. For example, in some embodiments, MAC layer 14 provides 128b of data at 500 MHz and PMA layer 12 outputs 130b of data at 400 MHz as encoder 102 encodes and provides the encoded data to FIFO 104 at 500 MHz, and FIFO 104 outputs the encoded data at 400 MHz.

Figure 6B:
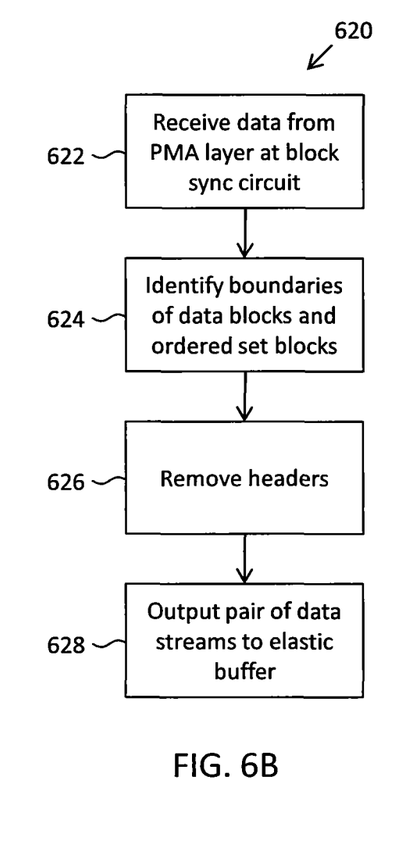
FIG. 6B is a flow diagram of one example of a method of receiving data from a physical media attachment layer in accordance with the physical coding sublayer illustrated in FIG. 2.

One example of a method 620 of receiving data from PCS 100 is described with reference to FIG. 6B. At block 622, encoded data from PMA layer 12 is received at block sync circuit 106. The data stream is received at block sync circuit 106 based on the CDRCLK clock signal. Block sync circuit 106 identifies the boundaries of 130b data blocks and the boundaries of variable-length ordered set blocks, such as SKP ordered set blocks, at block 624.

At block 626, decoder 108 decodes the data stream received from block sync circuit 106. The data is decoded by removing the two-bit headers that precede the data payload and ordered sets. Decoder 108 decodes the data based on the block_align signal and other control signals, e.g., start_01b, start_03b, start_05b, start_07b, start_09b, start_11b, start_13b, start_15b, start_17b, and start_19b signals, received from block sync circuit 106.

At block 628, decoder 108 outputs a pair of decoded data streams to bandwidth balance buffer 110. In some embodiment, for example, the pair of data streams output by decoder 108 have a different number of bits per block than the number of bits per block of the data stream received from block sync circuit 106. As described above, decoder 108 may receive a 20-bit serial data stream and output a pair of decoded 16-bit data streams, when needed, to bandwidth balance buffer 110. The outputting of a pair of 16-bit data streams instead of a single 20-bit data streams to bandwidth balance buffer 110 enables buffer 110 to have a simplified design compared to buffers configured to receive a single 20-bit data stream. For example, since the unit of added or removed symbols in the SKP ordered set in the third generation PCIe specification is four symbols (i.e., 32 bits), the 16-bit data steam makes it easier to add or remove four symbols compared to a 20-bit data stream in both design and implementation. If symbols are removed, for example, the bandwidth balance buffer 110 drops two cycles of data (i.e., two SKP symbols) and does not need to rearrange the input data stream to form a new 20-bit stream.

At block 628, bandwidth balance buffer 110 outputs a decoded data stream to MAC layer 14. The decoded data stream provided to MAC layer 14 is compensated for the reference clock differences between the ends of the a PCIe link.

In some embodiments, a physical coding sublayer includes a first channel configured to receive a first encoded data stream from a physical media attachment layer and to provide a first decoded data stream to a media access layer. The first channel includes a first circuit, a decoding circuit, and a single buffer. The first circuit is configured to detect synchronization headers in the first encoded data stream received from the physical media attachment layer. The decoding circuit is configured to decode the encoded data stream and to adjust a width of the received data from a first width to a second width based on a signal indicating the synchronization headers received from the first circuit. The single buffer is configured to compensate for reference clock differences between a first end of a peripheral component interconnect express link and a second end of a peripheral component interconnect express link to which the first buffer provides the first decoded data stream.

In some embodiments, a method includes receiving a first encoded data stream from a physical media attachment layer at a physical coding sublayer, identifying one or more block boundaries in the encoded data stream, and decoding the encoded data stream based the indication of the one or more block boundaries to provide a first decoded data stream having a first data width. A pair of decoded data streams having a second data width are generated in response to receiving the decoded data stream of the first width, and a second decoded data stream is output to a single buffer.

In some embodiments, a physical coding sublayer includes a data reception channel and a data transmission channel. The data reception channel includes a first circuit, a decoding circuit, and a single buffer. The first circuit is configured to detect synchronization headers in a first encoded data stream received from a physical media attachment layer. The decoding circuit is configured to decode the first encoded data stream and to adjust a width of the received data from a first width to a second width based on a signal indicating the synchronization headers received from the first circuit. The single buffer is configured to compensate for clock differences between a first end of a peripheral component interconnect express link and a second end of the peripheral interconnect express link to which the first buffer provides a first decoded data stream. The data transmission channel includes an encoder circuit and a first-in first-out register. The encoder circuit is configured to provide a second encoded data stream in response to receiving an uncoded data stream from the media access layer, and the first-in-first-out register is configured to transfer data between the media access layer and the physical media attachment layer to which the first-in-first-out register provides the second encoded data stream.

The disclosed architecture advantageously provides for an easier implementation compared to the architecture set forth in the PIPE specification. Although the disclosed architecture has been described in terms of exemplary embodiments, it is not limited thereto. Rather, the appended claims should be construed broadly, to include other variants and embodiments of the architecture, which may be made by those skilled in the art without departing from the scope and range of equivalents of the architecture.

What is claimed is:

1. A physical coding sublayer, comprising:
    a first channel configured to receive a first encoded data stream from a physical media attachment layer and to provide a first decoded data stream to a media access layer, the first channel including:
        a first circuit configured to detect synchronization headers in the first encoded data stream received from the physical media attachment layer;
        a decoding circuit configured to decode the encoded data stream and to adjust a width of the received data from a first width to a second width based on a signal indicating the synchronization headers received from the first circuit, wherein the decoding circuit includes a pair of parallel output ports each configured to output a respective data stream of the second width; and
a single buffer coupled to the pair of outputs of the decoding circuit and configured to combine the data streams output by the decoding circuit into a single data stream and to compensate for reference clock differences between a first end of a peripheral component interconnect express link and a second end of a peripheral component interconnect express link to which the single buffer provides the first decoded data stream.

2. The physical coding sublayer of claim 1, further comprising a second channel configured to receive an uncoded data stream from the media access layer and output a second encoded data stream to the physical media attachment layer.

3. The physical coding sublayer of claim 2, wherein the second channel includes:
an encoder circuit configured to encode the uncoded data stream; and
a first-in-first-out register configured to transfer data between the media access layer and the physical media attachment layer to which the first-in-first-out register provides the second encoded data stream.

4. The physical coding sublayer of claim 1, wherein the first width has more bits than the second width.

5. The physical coding sublayer of claim 1, wherein the first circuit is configured to output a signal to the decoding circuit that indicates at least one boundary of a data block or an ordered set in the first encoded data stream received from the physical media attachment layer.

6. The physical coding sublayer of claim 5, wherein the ordered set is used to compensate for different bit rates of the media access layer and the physical media attachment layer.

7. The physical coding sublayer of claim 1, wherein the decoder is configured to remove the synchronization headers in response to a signal from the first circuit.

8. A method, comprising:
receiving a first encoded data stream from a physical media attachment layer at a physical coding sublayer;
indicating one or more block boundaries in the encoded data stream;
decoding the encoded data stream based on the indication of the one or more block boundaries to provide a first decoded data stream and a second decoded data stream, the first decoded data stream and the second decoded data stream each having a first data width;
outputting the first decoded data stream from a first output port and the second decoded data stream from a second output port to a single buffer, wherein the first output port and the second output port are parallel output ports;
combining the first decoded data stream and the second decoded data stream into a third decoded data stream at the single buffer; and
outputting the third decoded data stream to a media access layer.

9. The method of claim 8, wherein the first data width is larger than the second data width.

10. The method of claim 8, wherein decoding the encoded data stream includes removing a header from one or more blocks based on the indication of the one or more block boundaries.

11. The method of claim 10, wherein the one or more blocks includes at least one block comprising a data payload.

12. The method of claim 10, wherein the one or more blocks includes at least one ordered set block for compensating for clock differences between the physical media attachment layer and a media access layer.

13. The method of claim 8, further comprising:
receiving an uncoded data stream from a media access layer;
encoding the uncoded data stream to provide a second encoded data stream; and
outputting the encoded data stream to a physical media attachment layer.

14. The method of claim 13, wherein encoding the uncoded data stream includes appending a first data payload to a first header.

15. The method of claim 13, wherein encoding the uncoded data stream includes appending a first ordered set to a first header.

16. A physical coding sublayer, comprising:
a data reception channel including:
a first circuit configured to detect synchronization headers in a first encoded data stream received from a physical media attachment layer,
a decoding circuit configured to decode the first encoded data stream and to adjust a width of the received data from a first width to a second width based on a signal identifying the synchronization headers received from the first circuit, wherein the decoding circuit includes a pair of parallel output ports each configured to output a respective data stream of the second width, and
a single buffer coupled to the pair of outputs of the decoding circuit and configured to combine the data streams output by the decoding circuit into a single data stream and to compensate for clock differences between a first end of a peripheral component interconnect express link and a second end of the peripheral interconnect express link to which the single buffer provides a first decoded data stream; and
a data transmission channel including:
an encoder circuit configured to provide a second encoded data stream in response to receiving an uncoded data stream from the media access layer, and
a first-in-first-out register configured to transfer data between the media access layer and the physical media attachment layer to which the first-in-first-out register provides the second encoded data stream.

17. The physical coding sublayer of claim 16, wherein the first width is greater than the second width.

18. The physical coding sublayer of claim 16, wherein the first circuit is configured to output a signal to the decoding circuit that identifies at least one boundary of one of an ordered set or a data payload in the first encoded data stream received from the physical media attachment layer.

* * * * *